US006888137B1

(12) United States Patent
Yamada et al.

(10) Patent No.: US 6,888,137 B1
(45) Date of Patent: May 3, 2005

(54) INSTRUMENT AND METHOD FOR OBSERVING SELECTED STORED IMAGES ACQUIRED FROM A SCANNING CHARGED-PARTICLE BEAM

(75) Inventors: Atsushi Yamada, Tokyo (JP); Tsutomu Negishi, Tokyo (JP); Toshiharu Kobayashi, Tokyo (JP); Norio Watanabe, Tokyo (JP)

(73) Assignee: JEOL Ltd., Tokyo (JP)

( * ) Notice: Subject to any disclaimer, the term of this patent is extended or adjusted under 35 U.S.C. 154(b) by 476 days.

(21) Appl. No.: 09/593,867

(22) Filed: Jun. 14, 2000

(30) Foreign Application Priority Data

Jun. 14, 1999 (JP) .......................................... 11-166731

(51) Int. Cl.[7] .......................... H01J 37/00; H01J 37/28
(52) U.S. Cl. ...................... 250/310; 250/311; 250/306; 250/307; 250/397
(58) Field of Search ................................ 250/306, 310, 250/492.1, 492.2, 492.22, 305, 397, 311

(56) References Cited

U.S. PATENT DOCUMENTS

| 5,834,774 A | 11/1998 | Negishi et al. ............. 250/310 |
| 6,225,628 B1 * | 5/2001 | Iwabuchi et al. ........... 250/310 |
| 6,768,114 B2 * | 7/2004 | Takagi ........................ 250/310 |

FOREIGN PATENT DOCUMENTS

JP          7130321          5/1995

* cited by examiner

Primary Examiner—John R. Lee
Assistant Examiner—David A. Vanore
(74) Attorney, Agent, or Firm—Webb Ziesenheim Logsdon Orkin & Hanson, P.C.

(57) ABSTRACT

There is disclosed a scanning electron charged-particle beam instrument facilitating a search for a desired field of view on a specimen. Also, a method of observing a specimen image with this instrument is disclosed. In field of view search mode, low-magnification images are gained from plural regions on the specimen. The image signals gained from the regions are sent to corresponding image memories and stored there. At the same time, the X and Y coordinates of the specimen at the low magnification are stored. If the image is rotated, the angular position and the direction are simultaneously stored. The image signals stored in the image memories are supplied to a CRT, and plural specimen images are displayed on the CRT. If a human operator selects a desired one out of the displayed images, a control unit controls a stage control unit according to coordinates read out, driving an X-Y translation stage. The stage is moved to bring a specimen position corresponding to the selected image onto the optical axis of the electron beam.

8 Claims, 3 Drawing Sheets

INSTRUMENT AND METHOD FOR OBSERVING SELECTED STORED IMAGES ACQUIRED FROM A SCANNING CHARGED-PARTICLE BEAM

BACKGROUND OF THE INVENTION

1. Field of the Invention

The present invention relates to a scanning charged-particle beam instrument such as a scanning electron microscope and, more particularly, to a scanning charged-particle beam instrument best suited for searching a specimen surface for a desired field of view and to a method of observing images of a specimen with such a scanning charged-particle beam instrument.

2. Description of the Related Art

In scanning electron microscopy, an electron beam emitted by an electron gun is focused onto a specimen by condenser lenses and an objective lens. The electron beam is scanned in two dimensions. As the specimen is irradiated with the electron beam, secondary electrons and other electrons are produced. These produced electrons are detected with a detector. The output signal from the detector is supplied to a cathode-ray tube synchronized to the scanning of the electron beam. Thus, a scanned image of the specimen is obtained.

Where an image of a specimen is observed using such a scanning electron microscope, the specimen stage is mechanically translated in the X- and Y-directions or rotated to permit the user to observe an image of a desired area on the specimen. Movements and rotations of the observed area are not limited to mechanical ones. They may also be accomplished by the image-shifting function for controlling the range in which the electron beam is deflected and by the scan rotation function for electrically rotating the direction of the two-dimensional scan of the electron beam.

Where a desired position on a specimen is brought onto the optical axis of the optical beam in this scanning electron microscope to perform close observation of the position, the area in which the electron beam is scanned in two dimensions is widened and the observation magnification is lowered. Then, the operator observes the low-magnification image and searches for the desired specimen position. Then, the stage on which the specimen is placed is moved to bring the desired specimen position onto the optical axis of the electron beam. After this sequence of operations, the area in which the beam is scanned in two dimensions is narrowed, and the magnification is made higher. The operator performs close observation of an image of the desired position on the specimen.

The image observation making use of the process steps described above is not necessary where the observation position has been previously determined. However, with respect to a specimen whose image is to be observed first, the above-described image observation steps are essential. Where a large specimen is treated, observations may be made at plural spaced positions. At this time, whenever the stage is mechanically moved, the operator must search for a desired field of view at the minimum magnification. Especially, if a specimen position of interest does not come within the field of view after the stage is moved and the search operation is performed at the minimum magnification, then the stage must be moved again, and the operator must search for a desired field of view.

SUMMARY OF THE INVENTION

In view of the foregoing, the present invention has been made.

It is an object of the present invention to provide a scanning charged-particle beam instrument permitting an operator to search for a desired field of view easily.

It is another object of the invention to provide a method of observing a specimen image with such a scanning charged-particle beam instrument.

These objects are achieved by a scanning charged-particle beam instrument in accordance with the present invention, the instrument having a specimen stage capable of moving in X- and Y-directions, a charged-particle beam illumination means for illuminating a specimen held on the specimen stage with a charged-particle beam, a scanning means for scanning the charged-particle beam in two dimensions across the specimen, a detector for detecting signals arising from the specimen, and a control means for displaying a scanned image of the specimen in response to the output signal from the detector. This instrument is characterized in that it comprises: a storage means for storing image signals of different fields of view on the specimen together with positional information relating to the fields of view on the specimen; a means for displaying plural specimen images simultaneously in response to the stored image signals of the plural fields of view; a selecting means for permitting one to select a desired one from the displayed specimen images; and moving means for moving the specimen into a position corresponding to the selected specimen image in response to said stored positional information.

Other objects and features of the invention will appear in the course of the description thereof, which follows.

DESCRIPTION OF THE PREFERRED EMBODIMENTS

Figure 1:
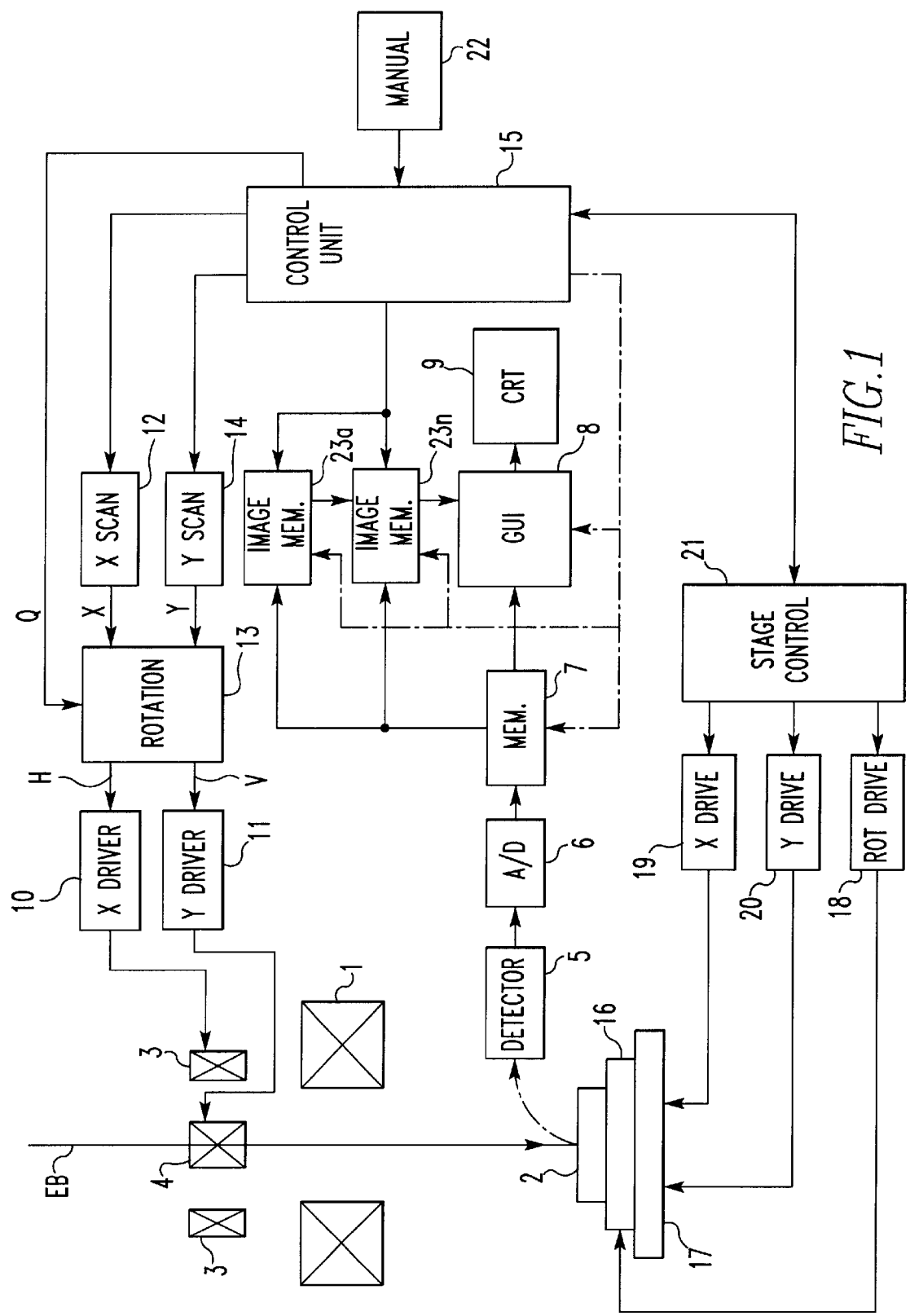
FIG. 1 is a block diagram of a scanning electron microscope embodying the concept of the present invention.

Referring to FIG. 1, there is shown a scanning electron microscope embodying the concept of the present invention. This instrument has an electron gun (not shown) emitting an electron beam EB. This beam EB is accelerated and sharply focused on a specimen 2 via condenser lenses (not shown) and via an objective lens 1. The electron beam is scanned across a desired area on the specimen 2 in two dimensions by an X deflection coil 3 and a Y deflection coil 4 for deflections in the X- and Y-directions, respectively.

As the electron beam EB hits the specimen 2, secondary electrons are produced. These electrons are detected by a secondary electron detector 5. The output signal from the detector is converted into a digital signal by an A/D converter 6. The output signal from the converter 6 is fed to an image memory 7, where the signal is stored. The signal stored in the memory 7 is read out and supplied to a cathode-ray tube (CRT) 9 via a graphical user interface (GUI) 8. As a result, a scanned image of the specimen is displayed on the CRT 9.

Deflection signals for scanning of the electron beam are supplied to the X deflection coil 3 and the Y deflection coil 4 from an X deflection driver circuit 10 and a Y deflection driver circuit 11, respectively. An X-direction scanning signal from an X-direction scanning signal generating circuit 12 is fed to the X deflection driver circuit 10 via a scan rotation circuit 13. A scanning signal generated by a Y-direction scanning signal generating circuit 14 is fed to the Y deflection driver circuit 11 via the scan rotation circuit 13.

The X-direction scanning signal generating circuit 12 and the Y-direction scanning signal generating circuit 14 are controlled according to magnification by a control unit 15 such as a CPU. In particular, as the magnification is set higher, the amplitudes of the scanning signals are decreased. At lower magnification, the amplitudes of the scanning signals are increased. The scan rotation circuit 13 is also controlled by the control unit 15.

The specimen 2 is placed on a rotating specimen stage 16, which in turn is carried on an X-Y translation stage 17. The stage 16 is rotated on the X-Y translation stage 17 by a rotational drive circuit 18. Furthermore, the X-Y translation stage 17 can be translated in the X- and Y-directions by an X-motion drive circuit 19 and a Y-motion drive circuit 20, respectively. The rotational drive circuit 18, the X-motion drive circuit 19, and the Y-motion drive circuit 20 are controlled by a stage control unit 21, which in turn is controlled by the control unit 15.

Manual operation means 22 such as a keyboard and a pointing device are connected with the control unit 15. Plural image memories 23a–23n are connected with the control unit 15. Images stored in the image memory 7 are appropriately read into the image memories 23a–23n and stored there under control of the control unit 15.

Information regarding the angular position of the rotating specimen stage 16 in obtaining images, the X and Y coordinates of the X-Y translation stage 17, and the angular positions of images rotated by the scan rotation circuit 13 is sent from the control unit 15 to the image memories 23a–23n, as well as the image signals, and stored as positional information about the specimen. The operation of the structure described thus far is described next.

Where a secondary electron image is observed, the operator operates the manual operation means 22 to set the magnification to a desired value. The control unit 15 controls the X-direction scanning signal generating circuit 12 and the Y-direction scanning signal generating circuit 14 according to the set magnification to cause the scanning circuits to produce X and Y scanning signals according to the magnification.

The X and Y scanning signals produced by the X-direction scanning signal generating circuit 12 and the Y-direction scanning signal generating circuit 14, respectively, are sent to the scan rotation circuit 13. This scan rotation circuit 13 creates deflection signals H (=X cos θ+Y sin θ) and V (=X cos θ−Y sin θ) to be supplied to the deflection coils 3 and 4, respectively, according to the angular position θ sent from the control unit 15 and the aforementioned X and Y scanning signals. The created signals are supplied to the deflection coils 3 and 4, respectively, via the driver circuits 10 and 11, respectively.

As the aforementioned scanning signals are supplied to the deflection coils, the electron beam EB is scanned in two dimensions within a desired range on the specimen 2. Impingement of the electron beam EB on the specimen 2 produces secondary electrons, which are detected by the secondary electron detector 5. The output signal from the detector 5 is converted into a digital signal by the A/D converter 6 and stored in the image memory 7 in synchronism with the scanning of the electron beam. The signals stored in the image memory 7 are read out and supplied to the CRT 9 via the GUI 8. Consequently, a secondary electron image of the specimen is displayed on the CRT 9.

Where the specimen 2 is mechanically rotated during observation of the image, the operator manually operates the manual operation means 22 to give instructions regarding the amount of rotation and so on. In response to the instructions, the control unit 15 controls the rotational drive circuit 18 via the stage control unit 21 to rotate the rotating specimen stage 16 through a given angle in a desired direction. As a result of these operations, the specimen is mechanically rotated and an observation of the image is executed.

Where the specimen is mechanically translated in the X- and Y-directions, the operator manually operates the manual operation means 22 to command amounts of movements in the X- and Y-directions. In response to the instructions, the control unit 15 controls the X-motion drive circuit 19 and the Y-motion drive circuit 20 via the stage control unit 21, thus causing the X-Y translation stage 17 to move given distances in given directions. As a result of these operations, the specimen 2 is mechanically moved, and the operator carries out observation of the image.

A case in which an image of the specimen 2 is electrically rotated and an observation is performed is next described. First, the operator manually operates the manual operation means 22 to give instructions on the electrical amount of rotation θ of the image. In response to the instructions, the control unit 15 sends information about the electrical amount of rotation θ to the scan rotation circuit 13, which in turn produces the X deflection signal H and the Y deflection signal V according to the amount of rotation θ.

Since these X deflection signal H and the Y deflection signal V are supplied to the X deflection coil 3 and the Y deflection coil 4 via the deflection driver circuits 10 and 11, respectively, the direction of two-dimensional scan of the electron beam EB on the specimen 2 is rotated through θ. In consequence, the operator can observe on the CRT 9 the image that has been rotated through θ.

An operation for searching for a desired field of view is next described. In the searching mode of operation, low-magnification images are previously obtained from plural areas on the specimen. In this case, the specimen 2 is translated in the X- and Y-directions. If necessary, the specimen 2 is rotated mechanically or the specimen image is rotated by scan rotation.

Whenever image signals are derived from the various areas, the signals are sent to some of the image memories 23a–23n from the image memory 7 under control of the control unit 15 and stored in these memories. When images are stored in the image memories 23a–23n, the X and Y coordinates of the specimen corresponding to the low magnifications at which the images were collected are stored, together with the images. If the images are rotated, their angular positions and directions are simultaneously stored.

Figure 2:
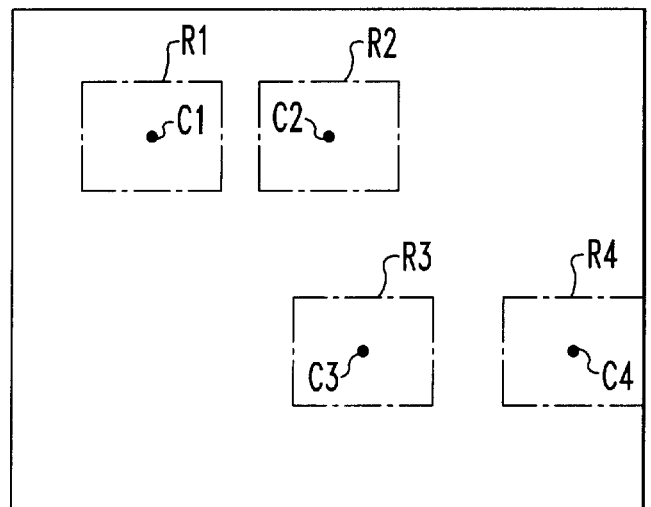
FIG. 2 is a view illustrating low-magnification areas of a specimen stored in the memories of the microscope shown in FIG. 1.

For example, four rectangular areas R1–R4 indicated by broken lines are present within the specimen 2 shown in FIG. 2. The electron beam is scanned across these four areas R1–R4. Resulting signals are detected by the detector 5. The output signal from the detector 5 is supplied to the image memories 23a–23d and stored there. At this time, X and Y coordinates of each area (e.g., the coordinates of the center positions C1–C4 of the areas, respectively) are stored in the image memories 23a–23d, respectively.

Figure 3:
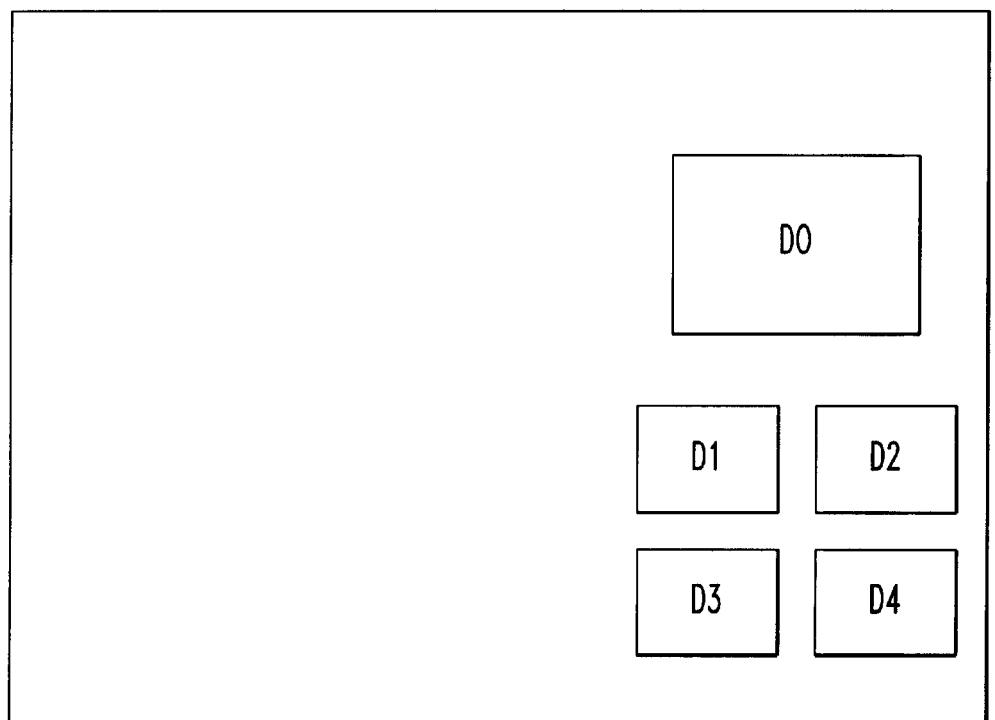
FIG. 3 is a view illustrating one example of an image displayed on the viewing screen of the CRT of the microscope shown in FIG. 1.

In the searching mode, the image signals stored in the image memories 23a–23d are read out via the GUI 8 under control of the control unit 15 and fed to the CRT 9. The specimen images based on the four image signals are displayed on separate regions on the CRT 9. FIG. 3 shows one example of the display, and in which low-magnification specimen images D1–D4 based on the four image signals are displayed around the right bottom corner of the viewing screen of the CRT 9.

A selected image display region D0 is formed near the right top corner of the viewing screen of the CRT 9. A selected low-magnification image displayed in this selected image display region D0 is selected from the four specimen images D1–D4. When this selection is made, the operator moves the cursor into an area where an image (any one of the specimen images D1–D4) that he or she wants to select is displayed, using a mouse contained in the manual operation means, and then the operator drags-and-drops the selected specimen image into the selected image display region D0 such that the selected image is displayed in the region D0. Furthermore, the selected specimen image may be displayed on the selected image display region D0 by moving the cursor into the area in which the specimen image the operator wants to select is present and by double-clicking the mouse.

As a result of the operations described above, the selected specimen image is displayed on the selected image display region D0. At the same time, the control unit 15 reads positional information concerning the selected specimen image from the image memory (any one of 23a–23n) in which the selected image is stored. For example, where the selected specimen image is D2, the coordinates of the center position C2 of the specimen area R2 are read from the image memory 23b.

The control unit 15 controls the stage control unit 21 according to the read coordinates, and drives the X-Y translation stage 17 via the X-motion drive circuit 19 and the Y-motion drive circuit 20. The stage is moved in such a way that the position C2 of the specimen 2 is placed onto the optical axis of the electron beam.

Where the four specimen images D1–D4 are rotated by rotating the specimen stage 16 or the four specimen images are rotated by the scan rotation circuit 13 when the specimen is translated in the X- and Y-directions, angular positions are stored in the image memories 23a–23h as positional information about the specimen, together with the X- and Y-coordinates of the specimen. When one specimen image is selected, information about rotation is read out, along with the X- and Y-coordinates. According to the information about the rotation, the rotational drive circuit 18 drives the rotating specimen stage 16 to set the specimen 2 to the same field of view (i.e., the same observational state) as when an image signal of the selected specimen image is gained.

After an area that the operator wants to display as a magnified image is displayed on the selected image display region D0, an observational position on the magnified image is selected, based on the image displayed on the region D0. The selection of this magnified image is made, for example, by moving the cursor into a desired position within the image displayed in the region D0 and clicking the mouse at this location. As a result of these operations, the control unit 15 controls the stage control unit 21 in such a way that the selected position on the specimen is brought onto the optical axis of the electron beam.

Simultaneously with the control over the specimen position, the control unit 15 controls the X-direction scanning signal generating circuit 12 and the Y-direction scanning signal generating circuit 14 according to the magnification of the magnified image set by operating the manual operation means 22. As a result, the magnified image of the selected specimen portion is displayed on the main portion of the viewing screen of the CRT 9.

Figure 4:
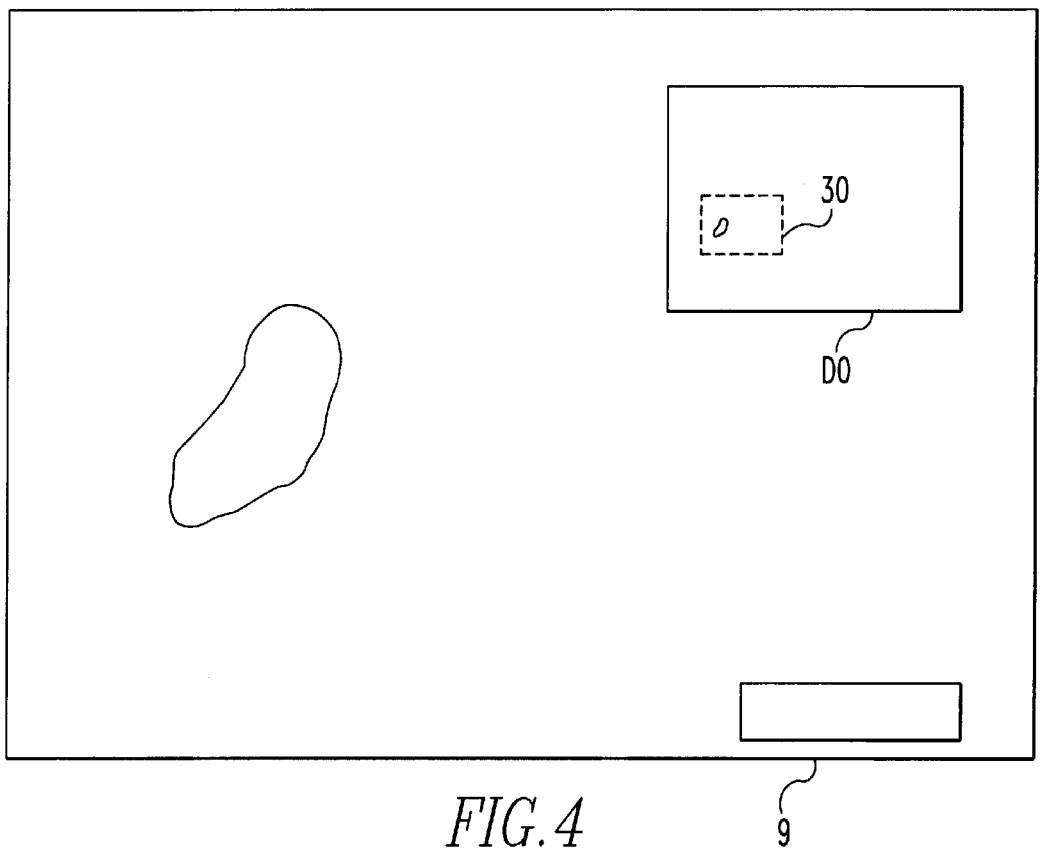
FIG. 4 is a view illustrating another example of an image displayed on the viewing screen of the CRT of the microscope shown in FIG. 1.

FIG. 4 shows an example of the display of the magnified image. The selected image display region D0 is displayed near the right top corner of the viewing screen of the CRT 9. If the operator designates an arbitrary point within the specimen image displayed in this region D0, a magnified image is displayed at the designated magnification around the designated point on the viewing screen of the CRT 9. At this time, a frame 30 is displayed in a region corresponding to the magnified image within the low-magnification image in the region D0. This permits the operator to recognize the position of the magnified view currently observed. The magnification of the magnified image is displayed around the left bottom corner of the viewing screen on the CRT.

While one preferred embodiment of the present invention has been described in detail, the invention is not limited thereto. For instance, in the embodiment described above, if the operator specifies an arbitrary point within the specimen image displayed within the region D0, the specimen stage is moved in such a way that the specified position on the specimen is brought onto the optical axis of the electron beam. Alternatively, a magnified image may be displayed at the specified magnification on the viewing screen of the CRT 9 only by deflection of the electron beam by scanning the electron beam about the specified specimen position according to the specified magnification without moving the specimen stage.

In the embodiment described above, a scanning electron microscope is taken as an example. The invention is also applicable to an instrument in which an ion beam is scanned to obtain a scanned image of a specimen. Furthermore, reflected electrons may be detected unlike the above-described embodiment in which secondary electrons are detected.

As described thus far, in the present invention, image signals of different fields of view on a specimen are stored in memory together with information about their positions on the specimen. Plural specimen images are displayed simultaneously according to stored image signals of plural fields of view. The operator selects a desired one out of the displayed specimen images. The specimen is automatically moved into the specimen position corresponding to the selected specimen image. Hence, the operator can easily conduct a search for fields of view.

What is claimed is:

1. A scanning charged-particle beam instrument having a specimen stage capable of moving in X- and Y-directions and providing positional information on a plurality of positions, and a charged-particle beam illumination means for illuminating a specimen held on the specimen stage with a charged-particle beam, a scanning means for scanning the charged-particle beam in two dimensions across the specimen in each of the plural positions providing different fields of view, a detector for detecting signals arising from the specimen, and a control means for displaying a scanned image of the specimen in response to an output signal from the detector, said scanning charged-particle beam instrument comprising:

a storage means for storing image signals corresponding to plural different fields of view on the specimen together with positional information relating to the plural fields of view on the specimen;

a means for displaying plural stored specimen images simultaneously in response to the said stored image signals of corresponding to the plural fields of view;

a selecting means for permitting an operator to select a desired specimen image from the displayed plural specimen images; and a moving means for moving the specimen into a position corresponding to the selected specimen image in response to said stored positional information.

2. The scanning charged-particle beam instrument of claim 1, wherein a magnified image at a desired position is displayed when a human operator specifies the desired position within a selected specimen image.

3. The scanning charged-particle beam instrument of claim 1, wherein said specimen stage or direction of two-dimensional scan of said charged-particle beam is rotatable, and wherein positional information about specimen positions stored in memory together with image signals includes information about rotation.

4. The scanning charged-particle beam instrument of claim 1, wherein if a human operator selects a desired specimen image from the displayed specimen images, the selected specimen image is displayed on a different region on the viewing screen.

5. A method of observing an image of a specimen with a scanning charged-particle beam instrument having a specimen stage capable of moving in X- and Y-directions and providing plural positions and positional information, a charged-particle beam illumination means for illuminating a specimen held on the specimen stage with a charged-particle beam, a scanning means for scanning the charged-particle beam in two dimensions across the specimen in each of the plurality of positions providing different fields of view, a detector for detecting signals arising from the specimen, a control means for displaying one or more scanned images of the specimen in response to an output signal from the detector, and a selecting means for permitting one to select a desired specimen image from the displayed specimen images, said method comprising the steps of:

storing plural image signals corresponding to plural different fields of view on the specimen in a memory together with positional information about positions of the plural fields of view on the specimen;

displaying said plural stored specimen images simultaneously according to the said stored image signals of corresponding to the fields of view;

prompting a human operator to select a desired image from the plural displayed specimen images using the selecting means; and automatically moving the specimen into a specimen position corresponding to the selected specimen image by accessing the stored positional information and moving the specimen stage to the corresponding position.

6. The method of claim 5, further comprising the step of permitting a human operator to designate a desired position from within the selected specimen image, thereby displaying a magnified image of the desired position.

7. The method of claim 5, wherein said specimen stage or direction of two-dimensional scan of said charged-particle beam is rotatable, and wherein positional information about specimen positions stored in a memory together with image signals includes information about rotation.

8. The method of claim 5, wherein the human operator selects a desired specimen image from the displayed specimen images and the selected specimen image is displayed on a different region on the viewing screen.

* * * * *

UNITED STATES PATENT AND TRADEMARK OFFICE
CERTIFICATE OF CORRECTION

PATENT NO. : 6,888,137 B1
DATED : May 3, 2005
INVENTOR(S) : Yamada et al.

It is certified that error appears in the above-identified patent and that said Letters Patent is hereby corrected as shown below:

Column 6,
Line 67, "signals of corresponding to" should read -- signals corresponding to --.

Column 8,
Lines 10-11, "signals of corresponding to" should read -- signals corresponding to --.

Signed and Sealed this

Thirteenth Day of December, 2005

JON W. DUDAS
*Director of the United States Patent and Trademark Office*